(12) United States Patent
Zeng

(10) Patent No.: US 7,291,549 B2
(45) Date of Patent: Nov. 6, 2007

(54) METHOD AND STRUCTURE TO REDUCE RISK OF GOLD EMBRITTLEMENT IN SOLDER JOINTS

(75) Inventor: Kejun Zeng, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/302,859

(22) Filed: Dec. 13, 2005

(65) Prior Publication Data

US 2006/0097398 A1 May 11, 2006

Related U.S. Application Data

(62) Division of application No. 10/763,146, filed on Jan. 22, 2004, now Pat. No. 7,005,745.

(51) Int. Cl.
*H01L 21/44* (2006.01)

(52) U.S. Cl. ............... 438/615; 438/612; 438/E23.023; 257/772

(58) Field of Classification Search ............... 438/612, 438/615; 257/772
See application file for complete search history.

(56) References Cited

U.S. PATENT DOCUMENTS

| | | | |
|---|---|---|---|
| 3,839,727 A | 10/1974 | Herdzik et al. | 257/737 |
| 4,622,202 A | 11/1986 | Yamada et al. | 376/246 |
| 5,011,658 A | 4/1991 | Niedrich | 420/558 |
| 6,744,142 B2 | 6/2004 | Liu et al. | 257/778 |
| 6,879,041 B2 | 4/2005 | Yamamoto et al. | 257/737 |
| 2004/0035909 A1* | 2/2004 | Yeh et al. | 228/56.3 |
| 2004/0262370 A1 | 12/2004 | Ano | 228/180.21 |

* cited by examiner

*Primary Examiner*—Nitin Parekh
(74) *Attorney, Agent, or Firm*—Yingsheng Tung; Wade James Brady, III; Frederick J. Telecky, Jr.

(57) ABSTRACT

A method for reducing gold embrittlement in solder joints, and a copper-bearing solder according to the method, are disclosed. Embodiments of the invention comprise adding copper to non-copper based solder, such as tin-lead solder. The embodiments may further comprise using the copper-bearing solder as a solder interconnect on a gold-nickel pad.

13 Claims, 2 Drawing Sheets

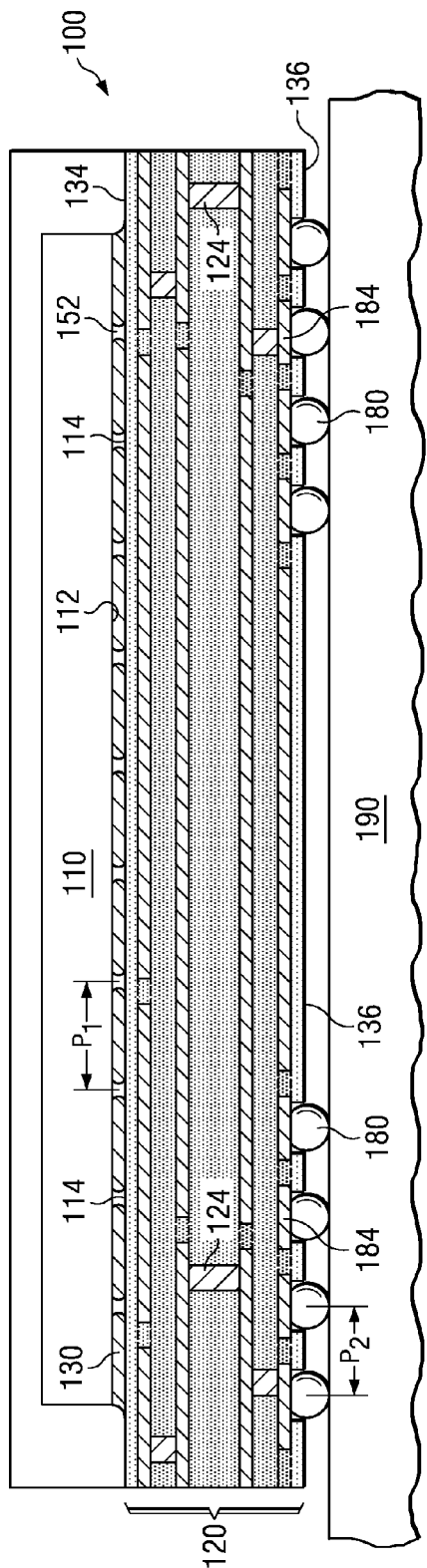
*FIG. 1* (PRIOR ART)
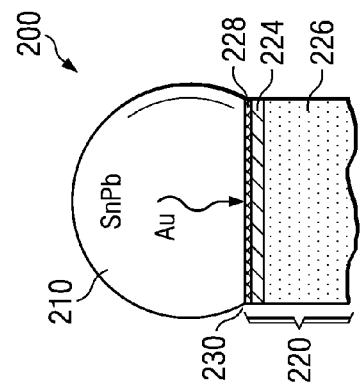
*FIG. 2C* (PRIOR ART)
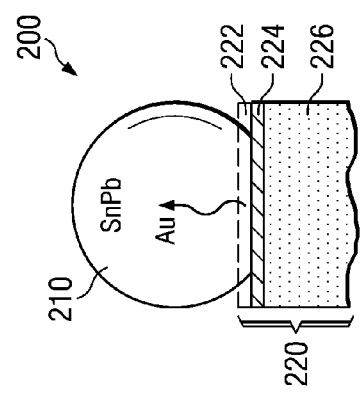
*FIG. 2B* (PRIOR ART)
*FIG. 2A* (PRIOR ART)

METHOD AND STRUCTURE TO REDUCE RISK OF GOLD EMBRITTLEMENT IN SOLDER JOINTS

This is a divisional application of application Ser. No. 10/763,146 filed Jan. 22, 2004 now U.S. Pat. No. 7,005,745, the contents of which are herein incorporated by reference in its entirety.

BACKGROUND OF THE INVENTION

Integrated circuits are fabricated on the surface of a semiconductor wafer in layers and later singulated into individual dies. FIG. 1 shows a cross-sectional view of a semiconductor die assembly 100 including a flip-chip die 110. Die 110, which could be a microprocessor, mechanically and electrically couples to a package substrate 120 through an arrangement of solder bumps 152 on the active face 112 of the die. To attach the die 110 it is first "bumped," or patterned with solder bumps 152. After bumping, the die 110 may be attached to an upper surface 134 of the package substrate 120 by melting the solder bumps 152, such as in an oven reflow process. An epoxy underfill material 130 may be introduced around the solder bumps 152 to improve solder joint reliability. Electrical communication through the package substrate 120 may be by way of conductive vertical columns, or substrate vias 124. Solder balls 180 attached to the bottom surface 136 of the package substrate 120 may thus allow electrical communication between the die 110 and a printed circuit board (PCB) 190 to which the package substrate 120 may be mounted.

Solder interconnects (e.g., solder bumps 152 between the die 110 and the package substrate 120, or solder balls 180 between the package substrate 120 and the PCB 190) may use similar solder compositions, such as eutectic tin-lead composition. FIG. 2A shows a cross-sectional view of a solder joint 200 prior to a reflow process. The solder joint comprises a solder ball or bump, which will be generically labeled a solder interconnect 210, joined to a solder pad 220. Solder pad 220 has a nickel-gold construction, comprising an outer gold (Au) layer 222, an underlying nickel (Ni) layer 224, and a copper (Cu) base 226. Referring now to FIG. 2B, during the reflow process the solder interconnect 210 is melted and the gold layer 222 is dissolved into the molten solder, exposing underlying nickel layer 224. The nickel layer 224 reacts with solder to form a $Ni_3Sn_4$ compound between solder and the nickel layer. After oven reflow, the solder interconnect 210 solidifies.

After reflow, solder joints may be exposed to temperature extremes during use, testing, and possibly storage. Post reflow exposure to elevated temperature, as well as exposure to temperature cycling, may cause the gold, that has been dissolved into a solder interconnect, to migrate toward the nickel layer 224. FIG. 2C shows the solder joint 200 of FIG. 2B after high-temperature exposure and/or exposure to temperature cycles. Above temperatures of about 25° C., gold has an affinity for nickel, and therefore the gold dissolved in the solder may migrate toward the nickel layer 224 in a solid-state diffusion process. However, since tin is also present, the gold tends to react with the tin in the solder to form a composition 228 called "gold-tin-four" ($AuSn_4$) at the interface 230 between the solder interconnect 210 and the exposed nickel layer 224. The gold-tin-four compound 228 is very brittle and greatly weakens the connection between the solder interconnect 210 and solder pad 220. While prior attempts to reduce the creation of $AuSn_4$ reduce the thickness of gold layer 222, this may not be practical with decreasing size of electrical devices.

As technology has advanced, the pitch (or center-to-center distance) P1, P2 between adjacent solder bumps 152 and/or solder balls 180 has decreased. As the pitch decreases, the size of solder pads 114, 184 on which solder bumps 152 and solder balls 180, respectively, rest is reduced, and therefore the size of solder joints 152 and 180 decreases. Gold layer thickness should be set such that after reflow the overall gold content in the solder joint is smaller than the saturation solubility of gold in the solid solder. Therefore, for a smaller solder joint, the gold layer should be thinner. However, the plating thickness of gold required in the solder pads 114, 184 may be thinner than existing plating processes can achieve. Consequently, methods and systems are desired for reducing the embrittlement of solder joints formed between eutectic solder interconnects and nickel-gold plating pads used in electronic or semiconductor devices.

SUMMARY OF THE INVENTION

A method for reducing gold embrittlement in solder joints, and a copper-bearing solder according to the method, are disclosed. Embodiments of the invention comprise adding copper to a non-copper based solder, such as tin-lead solder. The embodiments may further comprise using the copper-bearing solder as a solder interconnect on a gold-nickel pad.

BRIEF DESCRIPTION OF THE DRAWINGS

For a detailed description of the preferred embodiments of the invention, reference will now be made to the accompanying drawings in which:

FIG. 1 is a cross-sectional view of a semiconductor die assembly including a flip-chip die mounted to a printed circuit board (PCB) by a package substrate;

FIG. 2A is a cross-sectional view of an exemplary solder joint before an oven reflow process;

FIG. 2B is a cross-sectional view of the solder joint of FIG. 2A during an oven reflow process;

FIG. 2C is a cross-sectional view of a solder joint of FIG. 2B after high-temperature exposure;

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection.

Thus, if a first device couples to a second device, that connection may be through a direct connection, or through an indirect connection via other devices and connections.

A eutectic composition is herein defined as a mixture of two or more substances that has a lower melting point than any of its constituents considered alone. Similarly related is a eutectoid composition, which is herein defined as a mixture of substances which form two or three constituents from a solid instead of from a melt.

The term "semiconductor device" refers to a set of electronic components and their interconnections (internal electrical circuit elements, collectively) that are patterned on the surface of a silicon, or other suitable, semiconductor substrate. The term "die" ("dies" for plural) refers generically to a semiconductor device, including the underlying semiconductor substrate and all circuitry patterned thereon singulated from the wafer of semiconductor substrate. The term "wafer" refers to a generally round, single-crystal semiconductor substrate.

The term "interconnect" refers to a physical connection providing electrical communication between the connected items. The term "semiconductor package" refers generically to the components for encapsulating and interconnecting a die to a printed circuit board or package substrate. To the extent that any term is not specially defined in this specification, the intent is that the term is to be given its plain and ordinary meaning.

DETAILED DESCRIPTION OF THE PREFERRED EMBODIMENTS

At least some embodiments of the invention involve adding copper to a non-copper bearing solder. The presence of copper within a solder may reduce the embrittlement of solder interconnects using gold-nickel pads. The various embodiments of the invention were developed in the context of adding copper to tin-lead solder to reduce embrittlement, and will therefore be described in that context; however, the description based on the developmental context should not be construed as a limitation on the types of solders to which copper may be added to reduce embrittlement.

Figure 3A:
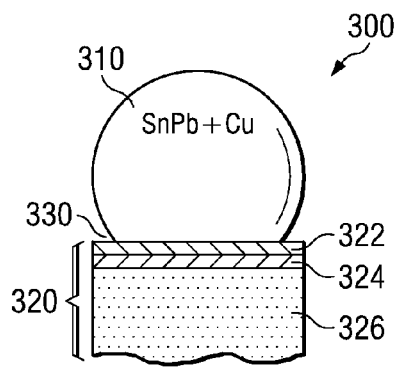
FIG. 3A is a cross-sectional view of a solder joint in accordance with some embodiments of the invention before an oven reflow process.

Referring now to FIG. 3A, a cross-sectional view is shown of a solder joint 300 comprising a solder interconnect 310 joined to a nickel-gold pad 320. The solder interconnect 310 may represent either a solder bump on a flip-chip die, a solder ball on a package substrate, or any other electronic interconnect. The pad 320 has a nickel-gold plating, which may comprise an outer gold layer 322 covering a nickel layer 324, both over a copper base 326. The nickel layer 224 may be pure nickel or electroless nickel (e.g., nickel-phosphorus, or NiP).

In accordance with at least some embodiments of the invention, copper is added to tin-lead (possibly eutectic) solder compositions to increase the solubility of gold in the solder. Increasing the solubility of gold in solder decreases the amount of gold that may diffuse towards interface 330 and thus reduce the risk of gold embrittlement in solder joints.

In accordance with embodiments of the invention, copper is added to tin-lead based eutectic solder, and the combination may therefore be referred to as copper-eutectic solder. While the addition of copper to tin-lead based eutectic solder is preferred, the solder need not necessarily be eutectic. Exemplary tin-lead solder compositions to which copper may be added comprise a 40 weight percentage (wt. %) Pb/60 wt. % Sn composition; a high-lead, 97 wt. % Pb/3 wt. % Sn composition; a 95 wt. % Pb/5 wt. % Sn composition; or a 90 wt. % Pb/10 wt. % Sn composition. Alternatively, new copper-eutectic solder compositions may be designed. The particular composition may be chosen depending on performance requirements or customer needs. Copper may be incorporated into lead-based solders such that copper comprises between 0.5 wt. % and 4 wt. % of the total composition.

Figure 3B:
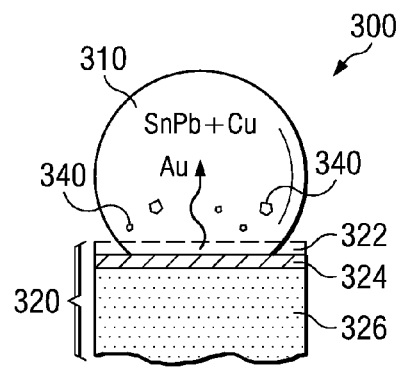
FIG. 3B is a cross-sectional view of the solder joint of FIG. 3A during an oven reflow process.

Referring now to FIG. 3B, solder joint 300 is shown during an oven reflow process, which may be used to attach the solder interconnect 310: to a package substrate (in the case of a solder bump); to a PCB (in the case of a solder ball); or, any two electrical devices at least partially coupled by way of solder joints. During the reflow process, the solder joint 300 is exposed to elevated temperatures, such as approximately 210° C., at which the solder interconnect 310 becomes molten. During reflow, the gold may dissolve into the molten solder, largely depleting gold layer 322 and exposing underlying nickel layer 324. After oven reflow, the solder interconnect 310 may solidify, with the copper and tin reacting to form precipitates 340 of "copper-six-tin-five" ($Cu_6Sn_5$) dispersed within the solder interconnect 310 and also at the interface between the nickel layer and solder.

Figure 3C:
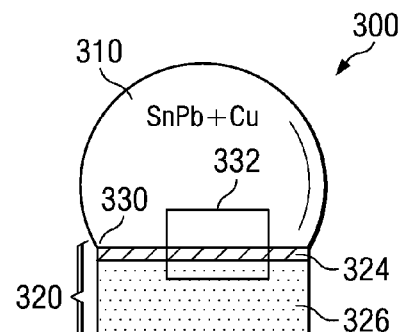
FIG. 3C is a cross-sectional view of a solder joint of FIG. 3B after high-temperature exposure.

The precipitates 340 of $Cu_6Sn_5$ act to reduce the formation of the embrittling $AuSn_4$ composition at interface 330 between solder interconnect 310 and nickel layer 324. Referring now to FIG. 3C, solder joint 300 of FIG. 3B is shown after high-temperature exposure. During high-temperature exposure, such as temperature cycling or high-temperature storage, the gold that previously dissolved into the then-molten solder would like to diffuse back out of the now-solidified solder interconnect 310 via solid-state diffusion. However, the presence of $Cu_6Sn_5$ in solder interconnect 310 acts to reduce gold migration back to the interface 330 as brittle $AuSn_4$. An expanded view of interface 330 denoted by an area 332 is shown in FIG. 3D.

Figure 3D:
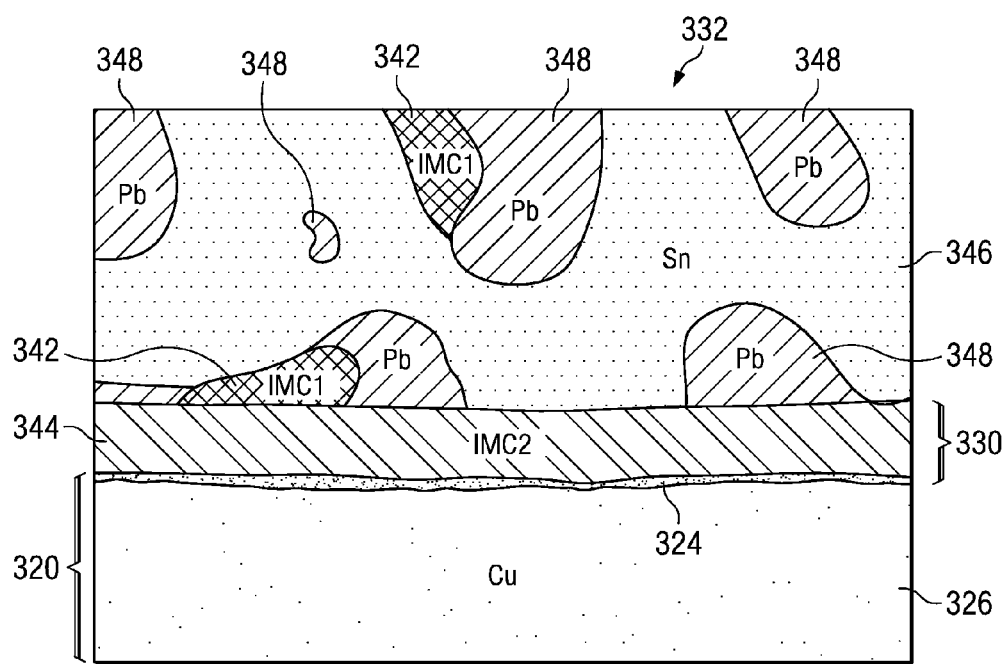
FIG. 3D is an expanded view of the solder joint interface of FIG. 3C after high-temperature exposure.

Referring now to FIG. 3D, expanded view 332 is shown of interface 330 between the solder interconnect 310 and the solder pad 320. The $Cu_6Sn_5$ precipitates (not shown in FIG. 3D) have a high affinity for both nickel and gold. As such, after high-temperature exposure, $Cu_6Sn_5$ may consume at least a portion of the gold and a portion of nickel from nickel layer 324 to form distinct intermetallic regions IMC1 342 and IMC2 344. Intermetallic regions 342, 344 may comprise compositions of $(Cu,Ni,Au)_6Sn_5$, where gold and nickel atoms have been dissolved into the sublattice of Cu in the crystalline $Cu_6Sn_5$, but the contents of nickel and gold may be different.

IMC1 342 and lead 348 may tend to randomly disperse within tin base 346 of the solder. In an exemplary embodiment, IMC1 342 may comprise more gold but less nickel than IMC2 344, and the IMC1 may be randomly dispersed in the solder. Conversely, IMC2 344 may tend to form over nickel layer 324. Intermetallic regions 342, 344 may be much less brittle than $AuSn_4$ that tends to form when a copper-free eutectic solder is attached to a gold-nickel pad and subjected to high temperatures.

The $Cu_6Sn_5$ formed within the solder as well as at the interface may contain gold in amounts of up to about 10 atomic percentage (at %). Without wishing to be bound by any particular theory, it is believed that the introduction of copper into eutectic solder, and the subsequent formation of $Cu_6Sn_5$ precipitates within the solder after reflow, act to sustain the solubility of gold in copper-eutectic solder. Preventing gold from diffusing back out of the solder reduces the formation of $AuSn_4$ at interface 330, thus protecting the solder joint 300 from increased brittleness and vulnerability to damage from thermal and mechanical stresses.

Although various embodiments are shown with the solder interconnects of a semiconductor die assembly (flip chip assembly) and BGA ball attachment, a copper-bearing solder interconnect in accordance with embodiments of the invention may be used with any electronic component having a nickel-gold pad for soldering. The copper-bearing solder in accordance with the embodiments may be used on any chip carrier or semiconductor packaging component using solder interconnects, including chip-scale packages (CSP), ceramic capacitors, quad flat no-lead (QFN) packages, leadless or leaded components, quad flat packages (QFP), and it also may be applied to a PCB assembly if the PCB pad has nickel-gold pads.

The above discussion is meant to be illustrative of the principles and various embodiments of the present invention. Numerous variations and modifications will become apparent to those skilled in the art once the above disclosure is fully appreciated. For example, now understanding that the addition of copper to a tin-lead solder may reduce embrittlement, it will be understood that copper may be added to other solders that do not contain copper, such as tin-bismuth solder, tin-silver solder, tin-zinc solder, tin-indium solder, and the like. It is intended that the following claims be interpreted to embrace all such variations and modifications.

What is claimed is:

1. A method of soldering electronic components comprising steps of:
   providing a electronic component having a solder pad covered with a nickel layer and a gold layer;
   placing a solder body including copper on the gold layer;
   heating the solder body thereby melting the solder body and completely dissolving the gold layer into the solder melt and exposing the nickel layer to the melt; and
   solidifying the solder melt thereby forming regions of copper intermetallic compound including copper and gold therein.

2. The method of claim 1, in which the solder body comprises tin.

3. The method of claim 1, further comprising maintaining a residual layer of nickel following the heating step.

4. The method of claim 1, in which the solder pad includes copper.

5. The method of claim 1, in which the copper intermetallic compound includes nickel.

6. The method of claim 1, in which the electronic component includes a printed circuit board.

7. The method of claim 6, in which the solder pad is on the printed circuit board.

8. The method of claim 1, in which the electronic component includes a flip-chip die.

9. The method of claim 8, in which the solder pad is on the die.

10. The method of claim 8, in which the solder pad is on the substrate.

11. The method of claim 1, in which the electronic component includes a flip-chip die and a substrate.

12. The method of 1, in which the solder body includes copper in the range of 0.5 weight percent to 4 weight percent.

13. The method of 1, in which the copper intermetallic compound includes gold up to 10 atomic weight percent.

* * * * *